(12) United States Patent
Cox

(10) Patent No.: US 7,248,071 B2
(45) Date of Patent: Jul. 24, 2007

(54) LOGIC ARRAY DEVICES HAVING COMPLEX MACRO-CELL ARCHITECTURE AND METHODS FACILITATING USE OF SAME

(75) Inventor: William D. Cox, Chapel Hill, NC (US)

(73) Assignee: ViASIC, Inc., Winston-Salem, NC (US)

( * ) Notice: Subject to any disclaimer, the term of this patent is extended or adjusted under 35 U.S.C. 154(b) by 174 days.

(21) Appl. No.: 11/023,860

(22) Filed: Dec. 28, 2004

(65) Prior Publication Data

US 2005/0117436 A1    Jun. 2, 2005

Related U.S. Application Data

(62) Division of application No. 10/234,926, filed on Sep. 4, 2002, now Pat. No. 6,873,185.

(60) Provisional application No. 60/389,843, filed on Jun. 19, 2002.

(51) Int. Cl.
*G06F 7/38* (2006.01)
*H03K 19/177* (2006.01)

(52) U.S. Cl. .............................. 326/39; 326/41; 326/47

(58) Field of Classification Search ............ 326/37–41, 326/47, 101
See application file for complete search history.

(56) References Cited

U.S. PATENT DOCUMENTS

| | | | |
|---|---|---|---|
| 5,068,603 A | 11/1991 | Mahoney | |
| 6,014,038 A | 1/2000 | How et al. | |
| 6,194,912 B1 | 2/2001 | Or-Bach | |
| 6,236,229 B1 * | 5/2001 | Or-Bach | 326/39 |
| 6,242,767 B1 * | 6/2001 | How et al. | 257/202 |
| 6,245,634 B1 | 6/2001 | Or-Bach | |
| 6,294,927 B1 | 9/2001 | Yoeli et al. | |
| 6,331,733 B1 | 12/2001 | Or-Bach et al. | |
| 6,331,789 B2 | 12/2001 | Or-Bach | |
| 6,331,790 B1 | 12/2001 | Or-Bach et al. | |
| 6,696,856 B1 | 2/2004 | Smith et al. | |
| 2004/0027156 A1 | 2/2004 | Amarilio et al. | |

* cited by examiner

*Primary Examiner*—Anh Q. Tran
(74) *Attorney, Agent, or Firm*—Moore & Van Allen PLLC; Steven B. Phillips

(57) ABSTRACT

Logic array devices having complex macro-cell architecture and methods facilitating use of same. A semiconductor device comprising an array of logic cells and programmable metal includes gate structures that are pre-wired, where, inputs and/or outputs are available for routing in programmable metal, possibly as part of a hybrid process. The device can also include selectable, in-line inverters, which can share the input/output tracks with logic inputs. A bubble-pushing algorithm can take advantage of the selectable in-line inverters to reduce the number of inverters in a design. In some embodiments, an embedded clock line is common to a plurality of logic cells. The clock line is terminated in a clock cell, which can include test logic, so that a clock group is formed. Flexibility to power down cells, or groups of cells can be provided by power traces with programmable connections.

10 Claims, 18 Drawing Sheets

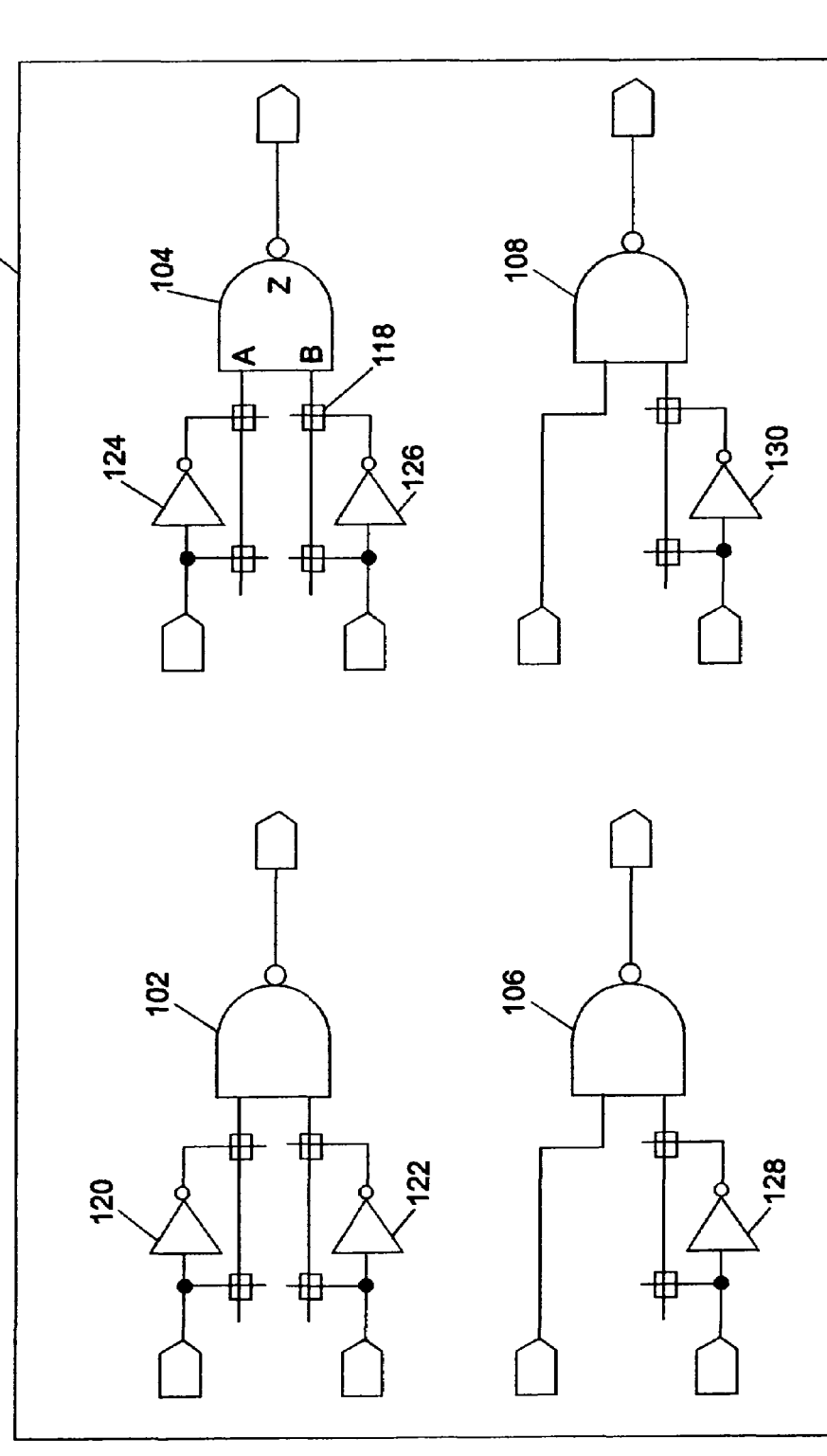

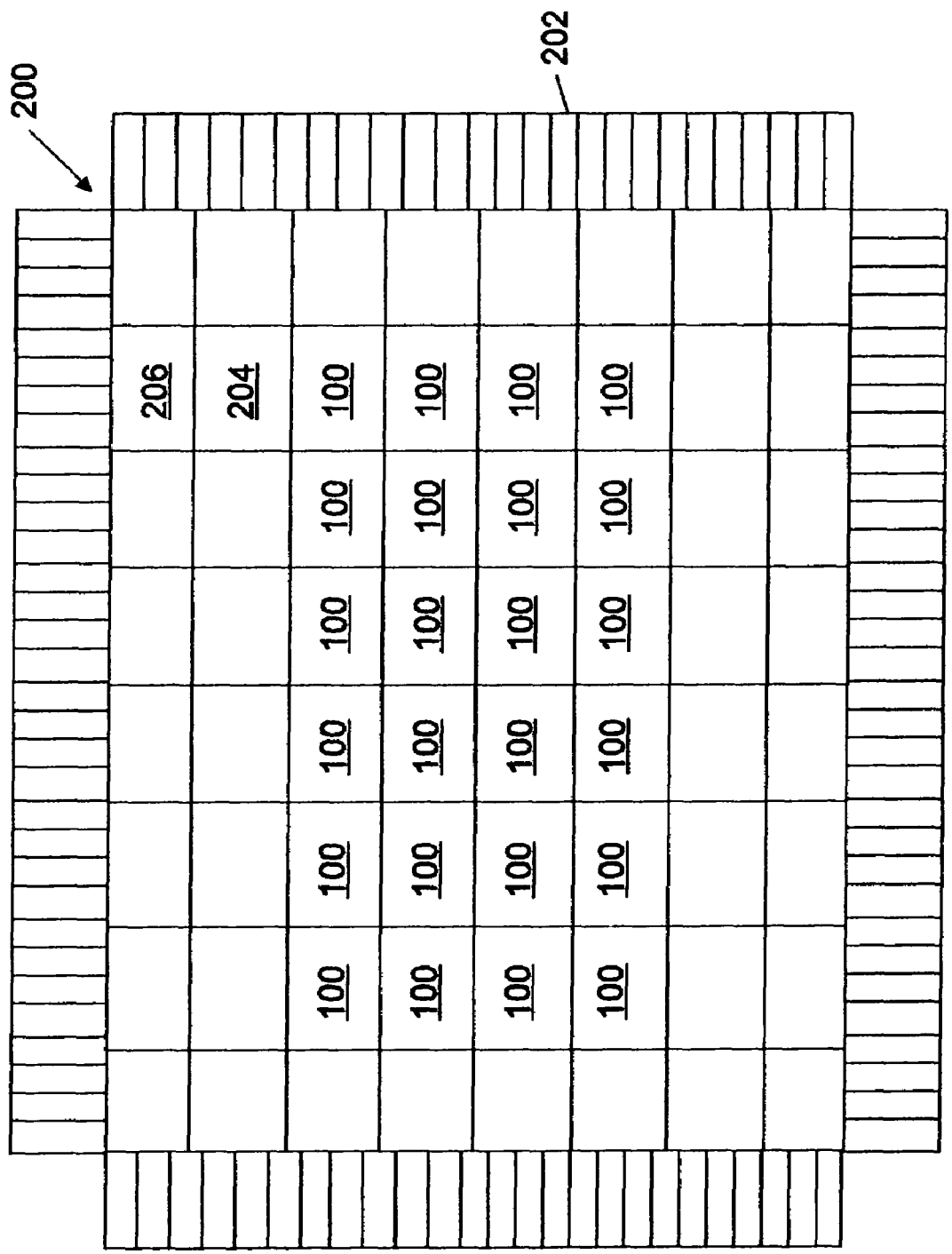

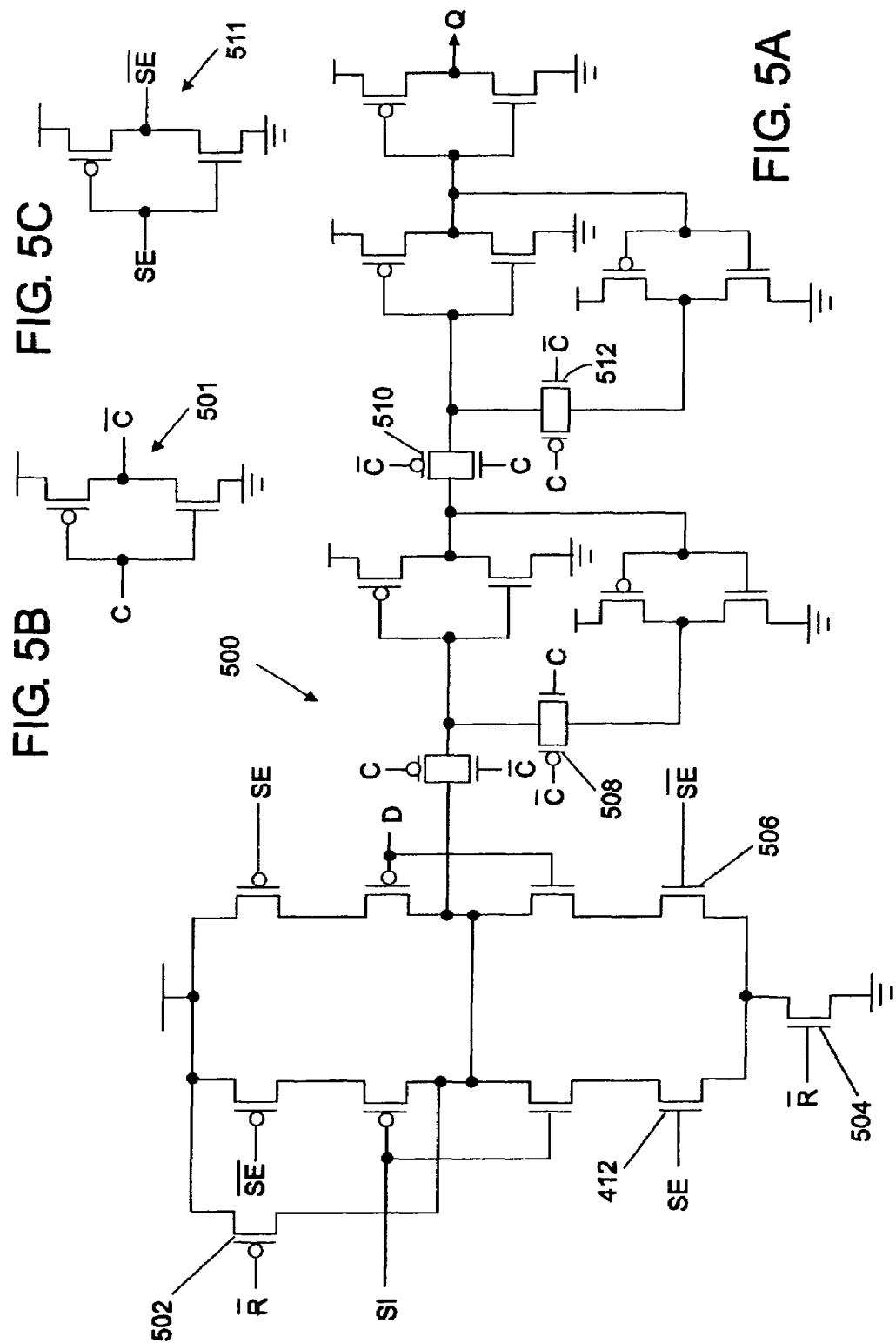

LOGIC ARRAY DEVICES HAVING COMPLEX MACRO-CELL ARCHITECTURE AND METHODS FACILITATING USE OF SAME

CROSS-REFERENCE TO RELATED APPLICATION

This application is a divisional application and claims priority from application Ser. No. 10/234,926 filed Sep. 4, 2002 now U.S. Pat. No. 6,873,185, which claims priority from commonly owned, now abandoned provisional patent application Ser. No. 60/389,843, filed Jun. 19, 2002. The entire disclosures of each of the foregoing applications are incorporated herein by reference.

BACKGROUND

For many years, gate arrays have been used to provide quick-turnaround (quick-turn), low non-recurring-expense (NRE) semiconductor devices for a variety of purposes. Traditionally, wafers are processed up to but not including the first (bottom) metal layer, and saved in inventory. When a customer orders a device to be fabricated for a specific application (an application specific integrated circuit or "ASIC"), the customer only pays for the masks to configure the metal layers, and not the transistor layers below. Thus, NRE is reduced. The wafers can be completed quickly, since only the metal layers remain to be fabricated, reducing turn-around time.

Recently more and more layers of metal have been incorporated into gate array semiconductor devices. Rather than two or three layers of metal, six to eight layers of metal is now common. As a result, gate arrays are often no longer very low-NRE, or quick-turn. In order to regain the advantages of earlier gate arrays, several vendors have developed logic arrays, consisting of multiple, substantially identical logic cells, which can be configured for an application with either fewer or cheaper masks. In the case of fewer masks, the total number of metal layers and hence masks used to create the finished device often does not change. Rather, only a reduced subset of the total number of metal layers in a finished device is used to impart the custom configuration to the device. For example, so-called "one-mask" devices, in which only a single metal layer and hence a single mask imparts customization, can in theory reduce both NRE and turn-time.

In parallel with the above developments, many modern wafer fabrication facilities ("fabs") that are capable of 0.18 u or better transistor channel lengths, have given up flexibility in manufacturing. Operators of these fabs are generally un-willing or unable to hold wafer inventory as had previously been done for gate arrays. This lack of inventory eliminates the quick-turn-time advantages of gate arrays. Also, these fabs typically require minimum orders of 25 to 100 wafers or more per mask set per month. Thus, the savings in NRE that a one-mask architecture can provide is typically less than the cost of a minimum order of wafers, reducing the advantages achievable from one-mask devices while leaving penalties of increased die area, increased power, and lower speed in place.

There have been attempts to achieve the benefits of advanced silicon from advanced fabs while providing the manufacturing flexibility needed to take advantage of quick-turn low NRE architectures. Laser-programming for proto-typing ASIC's has been used, thus reducing turn-times. Another technique is reduced mask or one-mask finishing of advanced wafers. For these products, an initial architecture on an advanced wafer process is used, and then is held by the fab customer. The cell design of this initial architecture is often referred to as the "macro-cell." A less advanced fab is then used to finish the wafers by configuring the few or single configuration masks. Such a process, split between two types of fabs, is often referred to as a "hybrid process." A hybrid process has the advantage of low turn-times, low NRE, and high manufacturing flexibility in being able to handle small orders. However, the combination of reduced or one-mask programming and a less advanced process geometry to accommodate the finishing can result in low achievable logic density.

SUMMARY

The present invention comprises a cell architecture for gate-array type devices such as ASIC's, both at the individual cell level and the chip level. The architecture of the invention has features, which are advantageous in terms of speed, density, and efficiency, especially with regard to hybrid processes. It should be noted, however, that at least some of the inventive features of the architecture can find general utility outside of hybrid process devices, even in non-gate-array semi-conductor devices.

In some embodiments, a semiconductor device comprising an array of logic cells and programmable metal includes one or more gate structures that are pre-wired in a first process geometry, where, a plurality of input and/or outputs of the gate structures are available for routing in at least two layers of the programmable metal, where the programmable metal is in a second process geometry. Each gate structure can be selected from a group consisting of at least a NAND, a multiplexer, a FLOP, an inverter, an XOR, a NOR, and a look-up table. In one embodiment, the cell specifically includes a plurality of NAND gates, a plurality of multiplexers, a FLOP, and a high-drive inverter. In some embodiments, distributed random access memory (RAM) can be included in cells.

In some embodiments, a semiconductor device according to the invention includes a plurality of input/output tracks, at least some of which correspond to input connections to gate structures in the cells. One or more of these inputs/output tracks includes a selectable, in-line inverter, which can share the input/output track. A selectable in-line inverter can be selectively placed in series with the input sharing the input/output track based on programmable connections.

Use can be made of the selectable, in-line inverters in many ways, one of which includes the application of a "bubble-pushing" method for reducing the number of inverters used in a final device design. In one embodiment of this method, a gate-level description of a logic-level design for a semiconductor device is read, and then converted to an initial semiconductor device design by converting gates in the gate-level description to available logic cell gates. Inverters are then pushed through a netlist of the initial semiconductor device design until each inverter arrives at an elimination point, wherein at least some elimination points are selectable, in-line inverters. Each selectable, in-line inverter is then "toggled" or switched between its current state in the design and the other state, wherein the two states are in-line with the associated input or disconnected from the input track. In some embodiments, other elimination points are select lines for multiplexers and inputs of the multiplexers must be swapped. Other points are inputs for multiplexers, and in this case, a selectable in-line inverter on the other input is toggled. An inverter is only needed on one input of a two-input multiplexer for bubble pushing to be effective. The method described above can be implemented by a general purpose workstation or personal computer system, also referred to herein as an "instruction execution system" running a computer program product containing computer program instructions. The instruction execution system in combination with the computer program instructions form the means to carry out the method.

In some embodiments, a semiconductor device according to the invention includes a scan chain embedded in at least some of the logic cells so as to use substantially none of the programmable metal. An embedded clock line is common to a plurality of FLOP's in a plurality of logic cells, which form at least a part of the scan chain. The clock line is terminated in a clock cell so that the clock cell and the plurality of logic cells form a clock group. The clock group may also include an embedded reset line, and/or other embedded lines. The clock group may contain one or multiple scan chains. The clock cell can contain test logic. In at least one embodiment, the test logic includes test and user clock terminals, test and user reset terminals and a test mode terminal. The test logic also includes a first multiplexer connected to the test and user clock terminals, and a second multiplexer connected to the test and user reset terminals. Testing can be accomplished by selecting test mode at a clock cell for a clock group to enable a test clock terminal and a test reset terminal and applying test data, then reading result data from one or more output terminals of the logic cells. This testing can possibly be accomplished through means of an automatic test pattern generation program.

In some embodiments of the invention, flexibility to power down cells, or groups of cells is provided by power traces in programmable metal traversing or adjacent to logic cells or clock cells. A programmable connection or programmable connections between the power trace and a cell or an embedded power line for a group of cells, such as a clock group, allows power to be selectively connected to a group of cells, or gate structures within a cell. In at least one embodiment, at least some of the programmable connections are implemented by vias.

BRIEF DESCRIPTION OF THE DRAWINGS

FIG. 1 is presented as FIGS. 1A and 1B.

FIG. 2 shows how some of the cells of a gate array device according to some embodiments of the invention can be arranged.

FIG. 4 is shown as FIGS. 4A and 4B for clarity.

FIG. 5 is a schematic diagram of the circuitry used to implement one of the gate structures of the cell of FIG. 1. FIG. 5 is shown as FIGS. 5A, 5B, and 5C for clarity.

FIG. 7 is presented as FIGS. 7A, 7B, and 7C for clarity.

FIG. 16 is presented as FIGS. 16A, 16B, and 16C for clarity.

DETAILED DESCRIPTION OF ONE OR MORE EMBODIMENTS

Figure 1B:
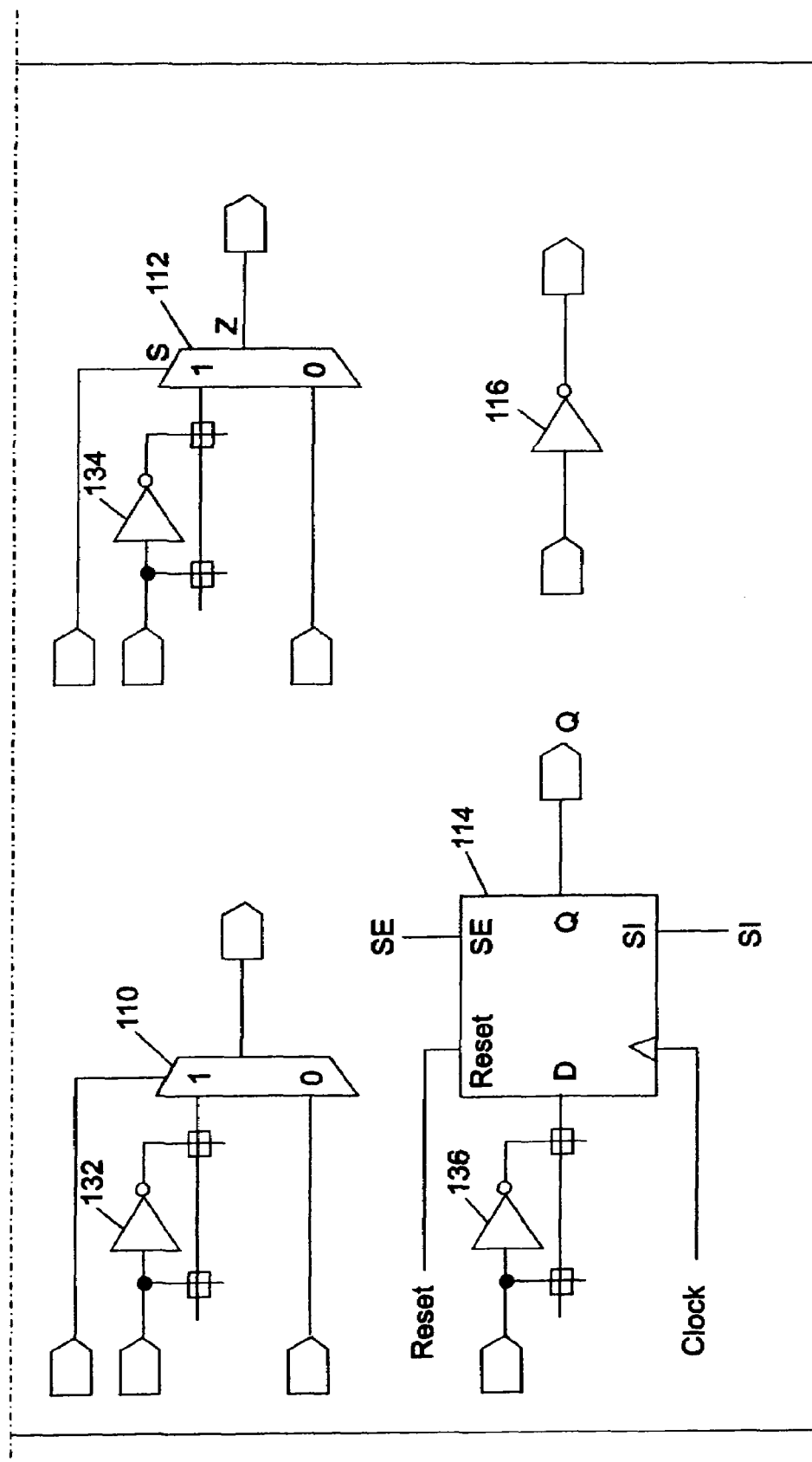
FIG. 1 is a logic diagram of a single cell of a logic array according to some embodiments of the invention.

The present invention will now be described in terms of specific, example embodiments. It is to be understood that the invention is not limited to the example embodiments disclosed. It should also be understood that not every feature of the semiconductor devices described is necessary to implement the invention as claimed in any particular one of the appended claims. Various elements and features of devices are described to fully enable the invention. It should also be understood that throughout this disclosure, where a process or method is shown or described, the steps of the method may be performed in any order or simultaneously, unless it is clear from the context that one step depends on another being performed first.

At least some of the drawings, which are used to illustrate the inventive concepts, are not mutually exclusive. Rather, each one has been tailored to illustrate a specific concept discussed. In some cases, the elements or steps shown in a particular drawing co-exist with others shown in a different drawing, but only certain elements or steps are shown for clarity. For example, selectable, in-line inverters can certainly be used with the programmable power connection features illustrated, or with distributed RAM.

The meaning of certain terms as used in the context of this disclosure should be understood as follows. The term "programmable" and variants such as "programmable metal" and "programmable layers" refer to the property or process finishing a device or the metal layers that are used to finish the device. These layers, at least in part, impart application-specific function to a semiconductor device, and are typically the layers left to be etched in the second fab in a hybrid process. The term "metal" used apart from the term "programmable" refers to any layers above the base silicon layers, which are used to make connections to implement the functions of the cells of a device. These metal layers may be the same for every version of a semiconductor device, or they may be used for configuration. In addition, metal layers may contain actual metal routing traces or vias, which provide vertical connectivity between metal routing layers. Programmable metal layers may be included in the metal layers. When lines, connections, or structures are referred to as "embedded" or "pre-wired" the meaning is that these lines, connections or structures are included in the base macro-cell, or non-programmable metal, or a combination of the two, and hence are not programmed with programmable metal.

The term "chip" and variations such as "integrated circuit chip" or "semi-conductor chip" are normally meant to refer to an intermediate device, which has not been configured, and may be in the form of a wafer. Such an intermediate device may or may not have non-programmable or "fixed" metal layers. A finished device such as an application-specific integrated circuit (ASIC) will be referred to as a "device" or with a variant term such as "semiconductor device" or the like. The term "logic array", "semiconductor array" and the like can refer to either finished or intermediate devices. Other terms will either be discussed when introduced, or otherwise should be assumed to have the conventional meaning as understood by persons of ordinary skill in the art.

As previously described, the architecture disclosed herein lends itself to a hybrid process, although, many of the features are useful and valuable outside of such a process. A typical example of such a hybrid process would consist of the following steps. The process begins by fabricating a complex macro-cell based logic array in an advanced process at an advanced wafer fab such as a 0.18 u or smaller fab, but only through some of the layers of metal. Next, the partially completed wafers are transported from the advanced wafer fab to a less advanced fab, such as 0.25 u or larger fab. The wafers are held in inventory until needed to complete a customer order. This "holding" may actually be either at the less advanced fab or at a customer's premises. In the latter case, it takes place prior to transporting the wafers to the less advanced fab. Devices are completed by finishing the wafers with customer-specific metal layers. Historically, only one metal layer has been configured at the less-advanced fab in a hybrid process. The architecture of the invention allows two or more layers of metal to be configured in the second fab, resulting in increased possibilities for custom configuring devices. Preferably, the less advanced wafer fab is already set up to manufacture gate arrays and already provides quick-turn, low NRE, and low minimum orders.

A process like that disclosed above works best if the basic cell design takes advantage of the initial, advanced fab techniques. In order to take full advantage of these techniques, a highly effective, complex macro-cell is used. Instead of connecting simple transistor pairs in the cell with the metal layer wiring, more complex gate structures are pre-wired in the base macro-cell. Pre-wired gates are gates that are connected together in the base layers. FIG. 1 illustrates a complex macro-cell, 100, used in some embodiments of the invention. This cell is implemented as a single rectangular cell in silicon suitable for tiling in an array. There are four NAND gates, 102, 104, 106, 108, two multiplexers (MUX's), 110 and 112, a FLIP-FLOP (FLOP), 114, and a high-drive inverter, 116. All of these gates structures are standalone gates in the sense that all of their input/outputs (I/O's) are available for routing in the programmable layers, and that they are not pre-wired to any other gates in the base. The boxes around some of the wire intersections, for example, as shown at 118, represent programmable connections in the programmable layers. Other variations of good complex logic cells can be obtained through using other types of gates, such as NOR and XOR gates, or through pre-wiring gates in the logic cell together. Another good type of gate to embed is a look-up-table (LUT). Extra inputs to FLOP 114, in addition to the D input and the Q output are for clock (CLK), reset (RST), scan-enable (SE), and scan-input (SI) as is well-understood in the art.

There are inverters shown that can optionally be wired in series with several inputs, at 120, 122, 124, 126, 128, 130, 132, 134, and 136. There are enough inverters in the cell to allow a netlist consisting of AND gates, OR gates, inverters, and FLOP's to be packed into the cell densely. To pack an AND gate into one of the cell's NAND gates, the output has to be inverted, and the destinations of the net it drives need to be inverted. To pack an OR gate into one of the cell's NAND gates, the inputs need to be inverted. The inverters allow this to be done. Any two-input function other than XOR and XNOR can be built with the NAND gates 102 and 104. NAND gates 106 and 108 have only one inverter each since it is unlikely that a design will need more than 75% of its inputs to the NAND gates inverted. In at least some embodiments, the inverters are actually selectable, in-line, inverters, as discussed later in this disclosure.

FIG. 2 is a conceptual block diagram showing the layout of a typical cell based logic array, 200. Programmable pads, 202, are shown around the edge of the die. The pads are typically programmed to be input, output, bi-directional pads, or power pads. This programming is done with custom metal connections in the programmable metal. The core of the array is primarily filled with logic cells, 100, as just described. Other embedded blocks can be included in the other cells, such as blocks that provide input and output function, CPU's or DLL's, as shown at 204 and 206.

Figure 3:
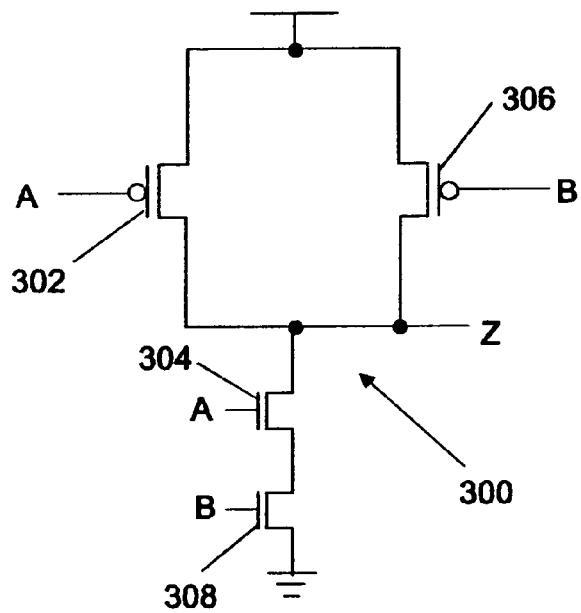
FIG. 3 is a schematic diagram of the circuitry used to implement one of the gate structures of the cell of FIG. 1.

FIG. 3 is a schematic showing one way to implement a NAND gate, 300, such as NAND gate 104 of FIG. 1. The input and output labeling corresponds to that shown on NAND gate 104 of FIG. 1. Input A is connected simultaneously to transistors 302 and 304, and input B is connected simultaneously to transistors 306 and 308.

Figure 4B:
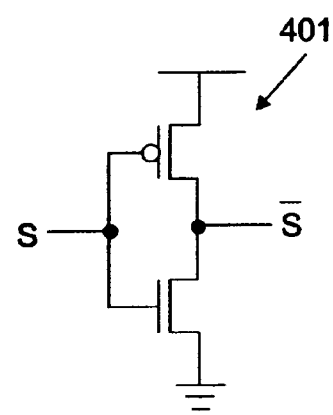
FIG. 4 is a schematic diagram of the circuitry used to implement one of the gate structures of the cell of FIG. 1.
Figure 4A:
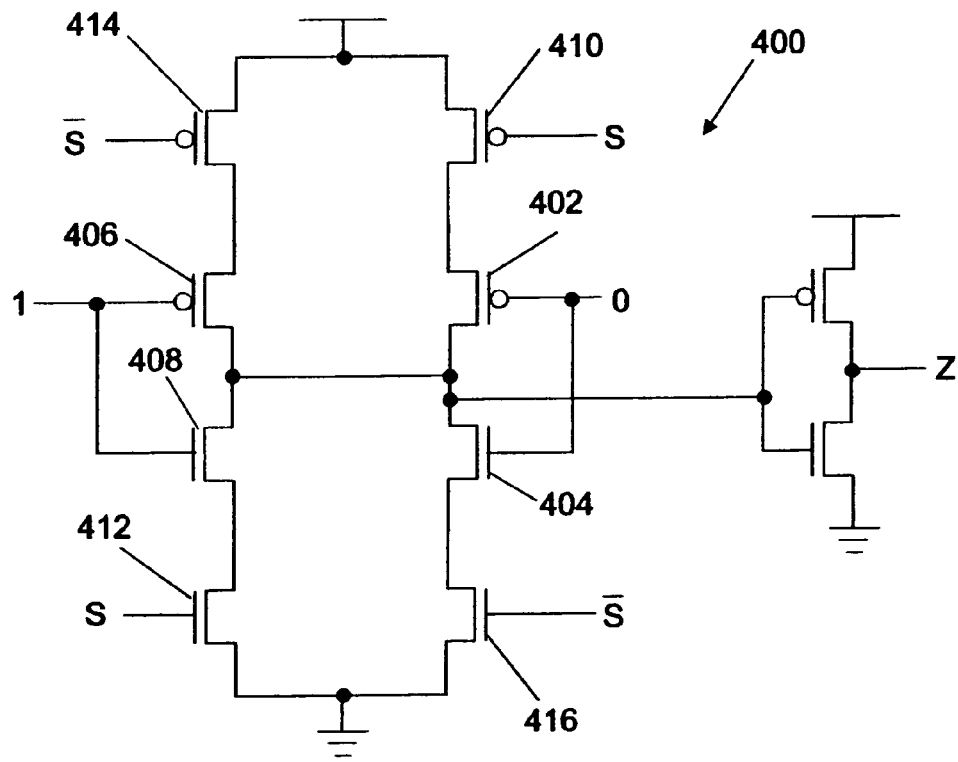

FIG. 4 consists of schematic diagrams showing one way to implement a MUX like those shown in FIG. 1. FIG. 4 includes FIGS. 4A and 4B. FIG. 4A shows the basic circuit, 400. Inputs and outputs are labeled to correspond with the labeling for MUX 112 of FIG. 1. Circuit 400 shows input 0 being connected to transistors 402 and 404, and input 1 being connected to transistors 406 and 408. The select line is connected to transistors 410 and 412. Transistors 414 and 416 accept the compliment of the select signal as input. FIG. 4B, shows a circuit, 401, which can be pre-wired adjacent to the MUX to provide the compliment of the select signal.

FIG. 5 consists of schematic diagrams showing one way to implement a FLOP like those shown in FIG. 1. FIG. 5 includes FIGS. 5A, 5B and 5C. FIG. 5A shows the basic circuit, 500. Inputs and outputs are labeled to correspond with inputs and outputs shown for FLOP 114 of FIG. 1. R is used in place of RST and C is used in place of CLK to conserve space. In some cases, this synchronous reset FLOP circuit, 500, as shown actually takes the compliment of a normal input as input, as shown with the inputs to transistors 502, 504, 506, 508, 510, and 512. FIG. 5B shows a circuit, 501, which can be embedded adjacent to the FLOP to generate the compliment of the clock, and FIG. 5C shows a circuit, 511, which can be embedded adjacent to the FLOP to generate the compliment of the scan enable signal. A similar circuit can be used to generate a compliment of the reset signal.

Figure 6:
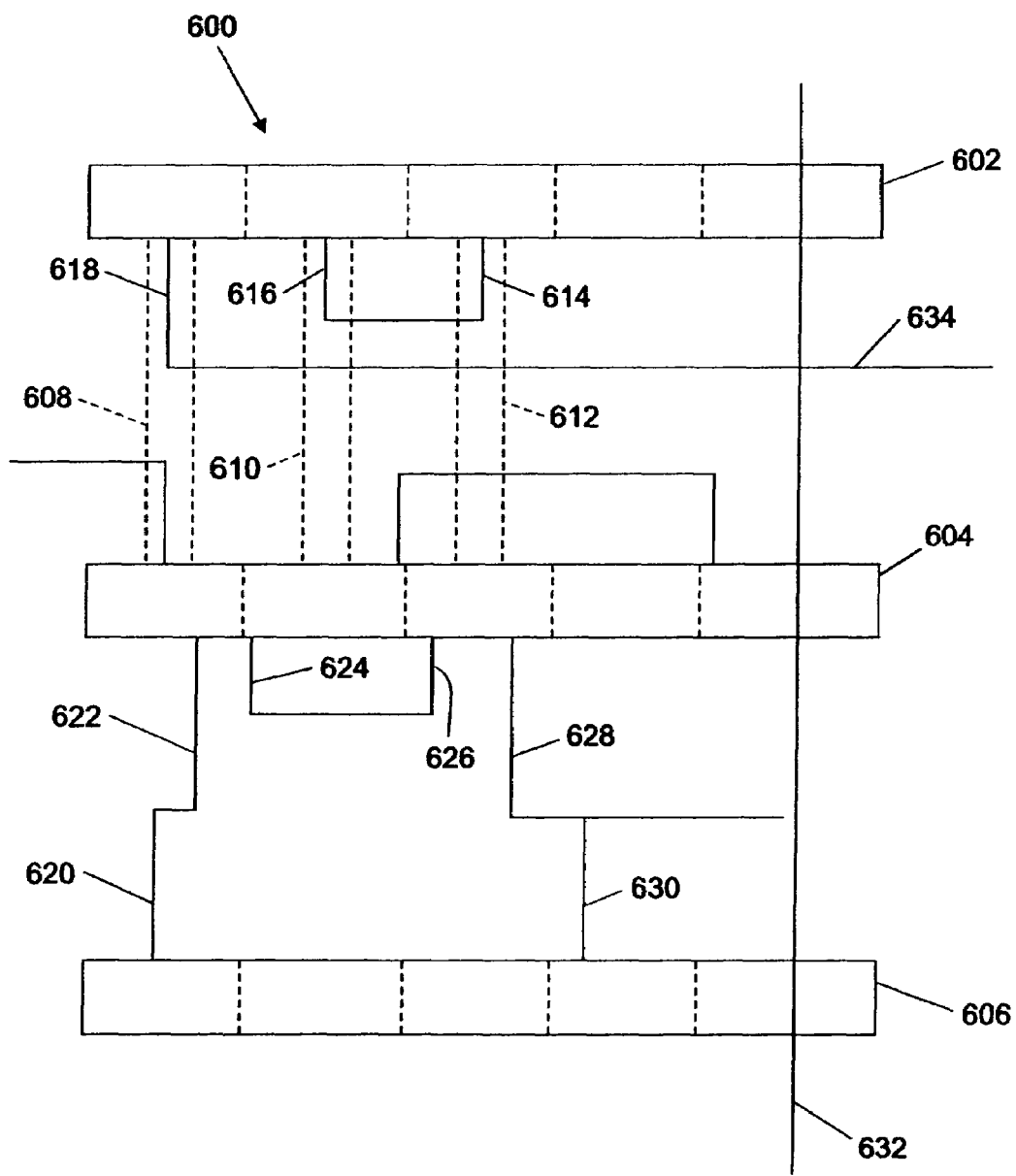
FIG. 6 illustrates how routing tracks are disposed within a semi-conductor device having cells according to some embodiments of the invention.

The reader will be aided in understanding some of the additional inventive concepts presented herein if he or she first has a basic understanding of what is meant by a "routing track" in terms of how metal traces are routed in a device according to the invention. FIG. 6 conceptually illustrates a typical layout of a logic array, such as might be used to implement embodiments of the invention, where I/O's of the logic cells have been lined up in rows. The view presented is that of looking down on top of a device, 600. Groups of I/O's visible from macro-cells below the metal are shown schematically at 602, 604, and 606. Routing tracks are the spaces in which metal traces or metal segments between I/O's are run by a routing program (called a "router"). Three of these routing tracks are shown at 608, 610, and 612, others are omitted for clarity. Typically a router will use the first layer of programmable metal between these I/Os to route vertically from the I/Os to horizontal metal tracks in the next higher metal layer. Metal layers are numbered from bottom to top as metal 1, metal 2, metal 3, etc., typically denoted M1, M2, M3, etc. FIG. 6 shows some typical connections, assuming the first programmable layer is M3, or the via layer between M2 and M3. The vertical metal segments in M3 are said to be in the I/O tracks of the logic cells, as shown at 614, 616, 618, 620, 622, 624, 628, and 630. The I/O tracks are simply the vertical or horizontal regions of metal lined up with the I/Os of logic cells that the router will typically use to reach the I/Os. A longer vertical routing trace, 632, is in layer M5. Horizontal routing traces are also shown, as at 634. These are in layer M4. As an additional note on terminology, connecting metal segments embedded in the base cell or non-programmable metal are generally referred to herein as "lines" whereas connections within programmable metal are generally referred to as "traces" whether or not they fall within routing tracks.

To avoid having to use many gate structures in the base cell of the invention as inverters, inverters have been added to the macro-cell in some embodiments of the invention, where their I/O's are lined up directly with the inputs of some of the gate structures. These inverters in effect "share" in I/O routing track with an input of a gate structure, so that the input may be optionally inverted without wasting any routing tracks. Such an inverter is referred to herein as a "selectable, in-line inverter." A selectable in-line inverter, when used gets its input signal from the same I/O track as the input it inverts.

Figure 7A:
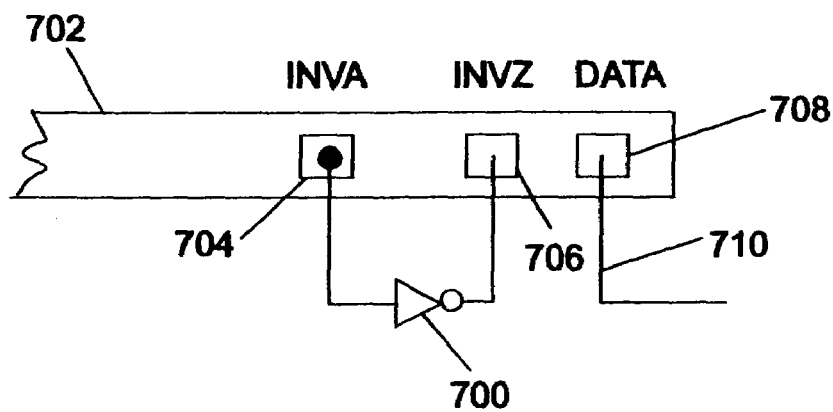
FIG. 7 is a logic diagram that shows the design of a selectable, in-line inverter.
Figure 7B:
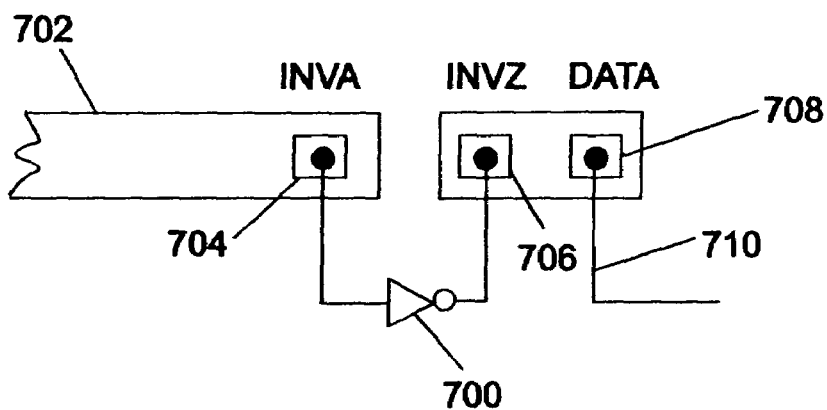
Figure 7C:
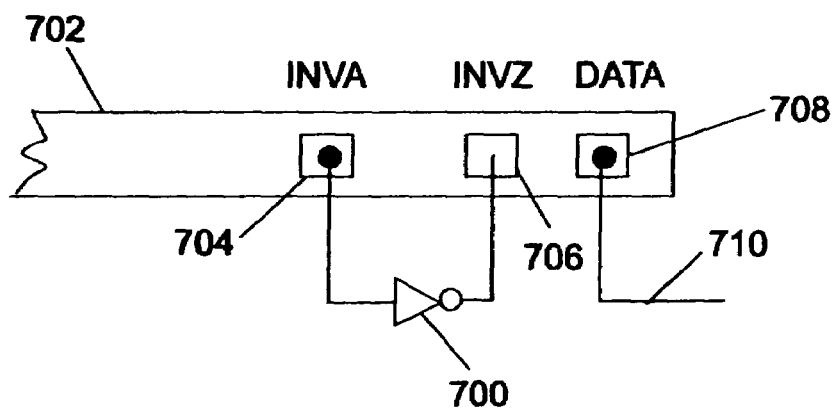

FIG. 7 shows a close-up view of one embodiment of a selectable, in-line inverter. FIG. 7 shows the inverter, 700 in different connection states in FIGS. 7A, 7B, and 7C. In all cases, the inverter is shown connected to a trace, 702, in a horizontal I/O track in M3, with programmable vias down to M2. There are two vias, 704 and 706 to connect the inverter to the I/O trace, and one via, 708, to connect to the logic input that owns this track. The via for the inverter input is labeled INVA, the via for the inverter output is labeled INVZ, and the via for the logic input, 710, is labeled data. If a via has a dot, it is connected. An open square represents an unconnected via. In FIG. 7A, the input in the track is unused. In FIG. 7B, the inverter has been wired in series with the logic input, while leaving most of the I/O track available for routing. In FIG. 7C, the inverter is bypassed, although its input is tied to the logic input. This tie causes some additional power to be dissipated, but no additional programming area is required to tie-off the inverter's input to a supply. Alternatively, the inverter's input could be tied off, but more metal in the programmable layers would be needed.

Figure 8:
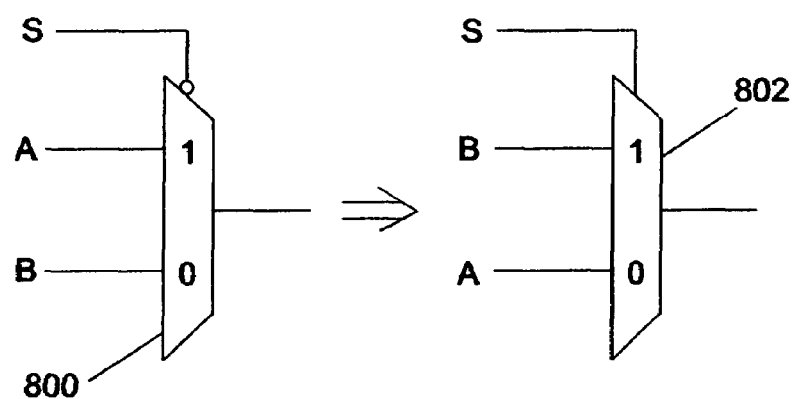
FIG. 8 illustrates one aspect of an embodiment of the technique of "bubble-pushing" at the logic level.
Figure 9:
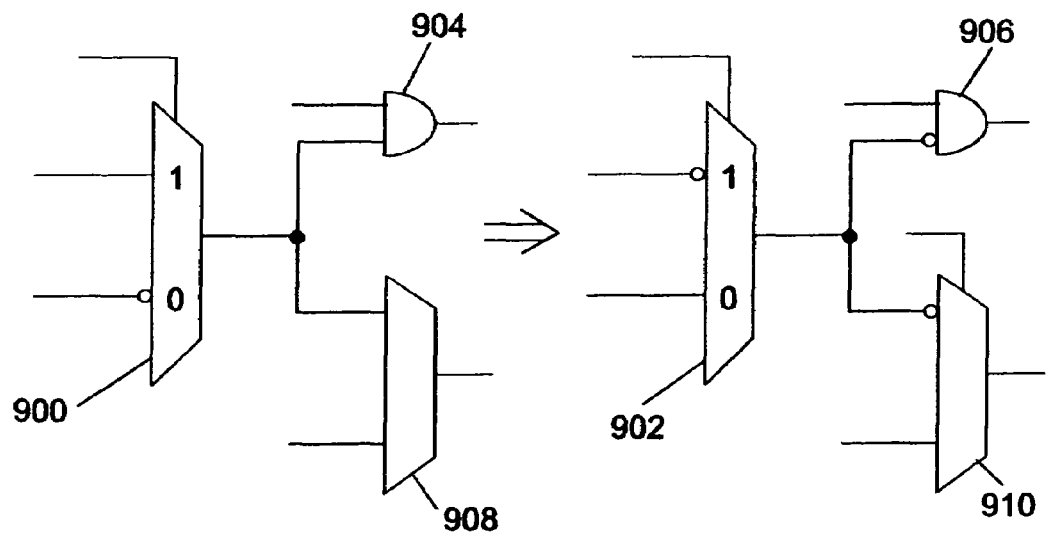
FIG. 9 illustrates another aspect of an embodiment of the technique of "bubble-pushing" at the logic level.

The input inverters are used in conjunction with a process, herein called "bubble-pushing" to maximize the number of logic gates that can fit in a logic cell. It is axiomatic to those of skill in the logic design arts that inverters can be combined with certain gate structures to implement other gate structures. For example, a NOR gate can be implemented with a NAND gate by inverting both inputs of a NAND gate, and inverting the inputs that the NAND gate drives. If every input has a selectable, in-line inverter, inputs driven by a net could always be inverted. However, with bubble-pushing, every input does not need to have a selectable inverter. FIG. 8 shows how to eliminate an inverter on the select line of a MUX by swapping its data inputs. In this case, MUX 800 becomes MUX 802. FIG. 9 shows how to move an inverter from the 0 input of MUX 900 to the 1 input of a MUX, 902, by pushing the inversion through the MUX and onto the destinations of the net it drives. In this case, AND gate 904 takes on an inverter at it's input as shown at 906, and MUX 908 takes on an inverter at its input as shown at 910. Thus, in many cases, by having a selectable inverter on only the 1 input, input inverters on a MUX can ultimately be eliminated. There are exceptions when an inverter is in a combinatorial feedback path with the MUX. However, the architecture of the present invention generally calls for an inverter on only a single input, which saves area when compared with designs that have inverters on both inputs of a two-input MUX.

Figure 10:
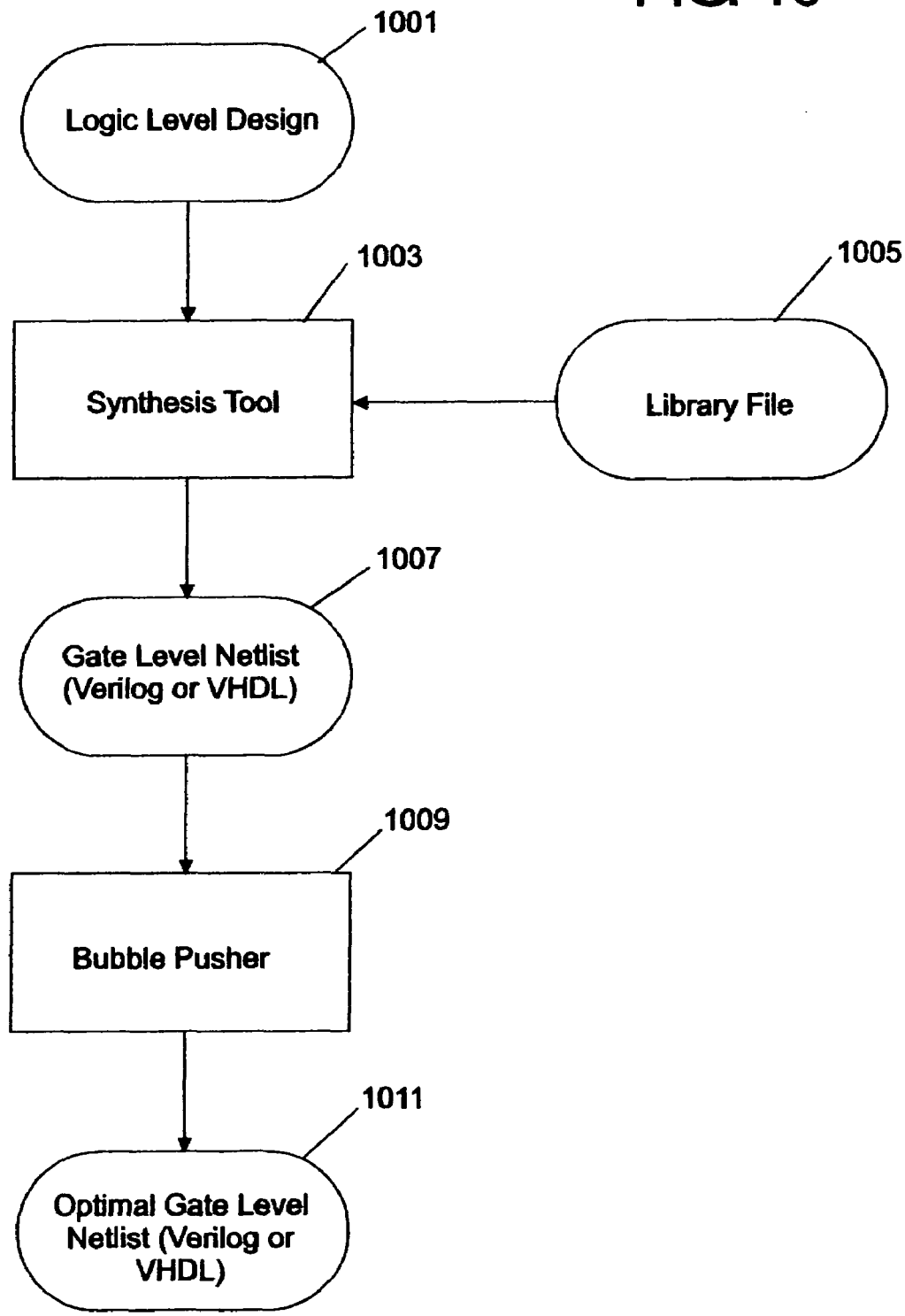
FIG. 10 is a flowchart showing how the technique of bubble-pushing according to the invention can be applied to a logic design.
Figure 11:
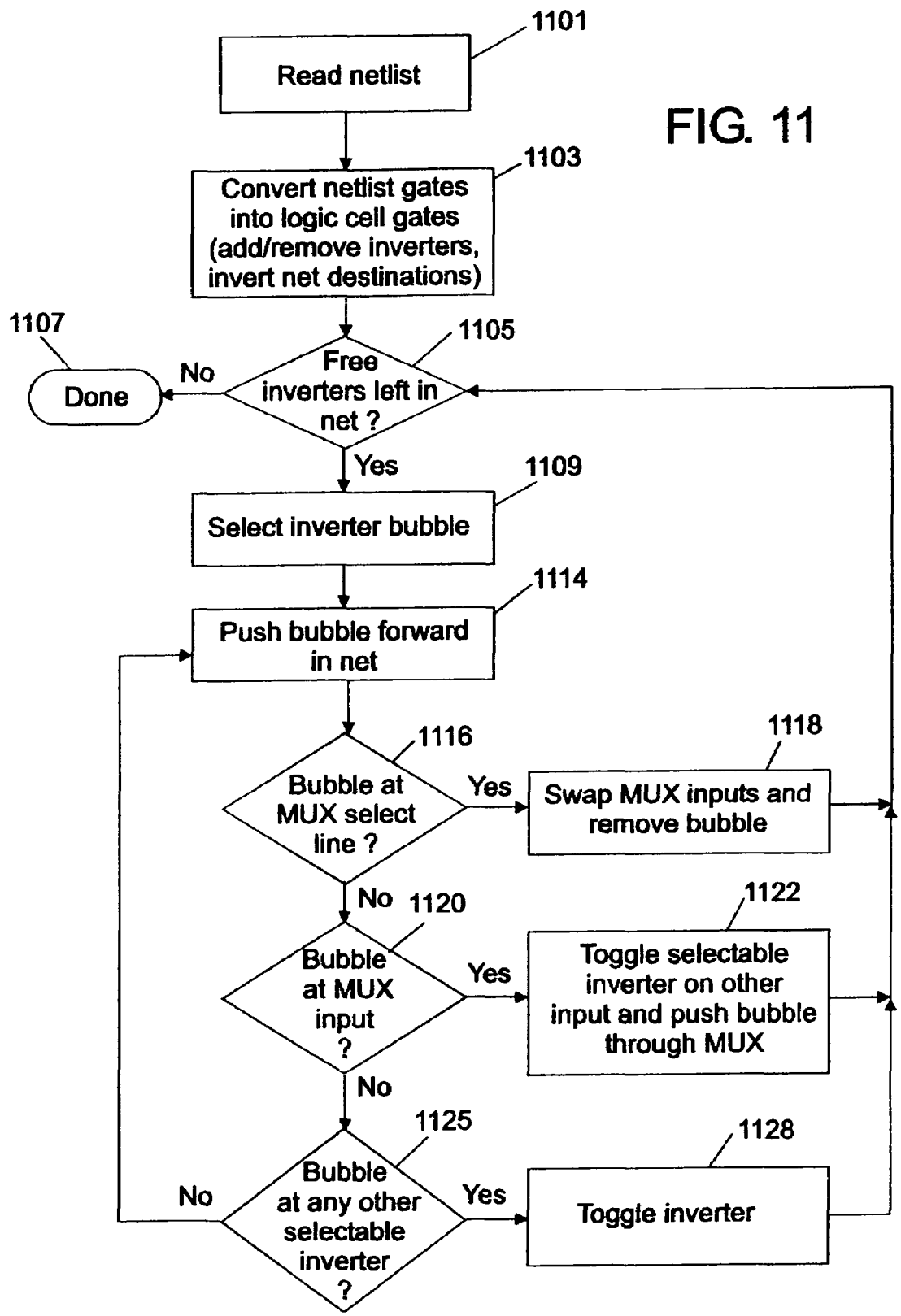
FIG. 11 is a more detailed flowchart illustrating one embodiment of the bubble-pushing technique.

FIGS. 10 and 11 show a method, in flowchart form, which includes a bubble-pusher. In FIG. 10, the user creates a gate-level description of a logic-level design, 1001, for a semiconductor device in a hardware description language such as Verilog or Very High-speed integrated circuit Definition Language (VHDL). The user then synthesizes the design with a synthesis tool at step 1003 into a gate level netlist of an initial semiconductor device design. The synthesis tool takes a library file, 1005, describing the gates to be used in the netlist, as well as the user's design, as inputs. The output is a gate-level netlist, 1007, in terms of components described in the library file. Typically, components in the library have an associated cost, and the synthesis tool tries to minimize the total cost of the design described by the netlist. Since bubble-pushing is a post-process to the synthesis tool, it is advantageous for cost accuracy to include an inverter in the library file which has very low, or zero cost, since the bubble-pushing post-process will eliminate most inverters. At step 1009, the bubble pusher reads the gate level netlist. It then converts gates in the netlist to gates that can be implemented in the logic cell, by adding or removing inverters, and inverting net destinations. Then, inverters are pushed forward through the netlist elements by the bubble pusher algorithm until they arrive at inputs where they can be eliminated, such as a MUX select line, or an input with a selectable inverter. The bubble pusher can then create a new gate level netlist in terms of elements available in the logic cell, and without many inverters, which are not selectable in-line inverters. This new, optimal, netlist, 1011, specifies the final semiconductor device design.

FIG. 11 illustrates the process followed by the bubble pusher in flowchart form. The netlist is read at step 1101. At step 1103, netlist gates are converted to logic cell gates, that is, gate structures that are available in the macro-cell design. For example, the design could be that discussed with respect to FIG. 1. This conversion is accomplished by adding and removing inverters and inverting net destinations. At step 1105 a determination is made as to whether there are free inverters left in the net. If not, the "bubble pushing" per se is not needed, and the process ends at 1107. If so, as will usually be the case on the initial pass, the bubble pusher proceeds to "push" these inverters (or "bubbles") through the net as previously described. An inverter is selected at step 1109, and pushed forward at step 1114. If the bubble arrives at a MUX select line at step 1116, the MUX inputs are swapped and the bubble is removed at step 1118. If the bubble instead arrives at a MUX input at step 1120, the selectable in-line inverter on the other input is "toggled," meaning changed from connected in series with the input, to not connected in series with the input, or vice versa as the case may be. The bubble is then pushed through the MUX at step 1122, and will be pushed again on another pass. If the bubble arrives at any other selectable, in-line inverter at 1125, that inverter is toggled at step 1128. In all cases, processing returns to 1105 and 1109, where another bubble (or the "same" bubble) can be pushed further if there are any free inverters left.

Figure 12:
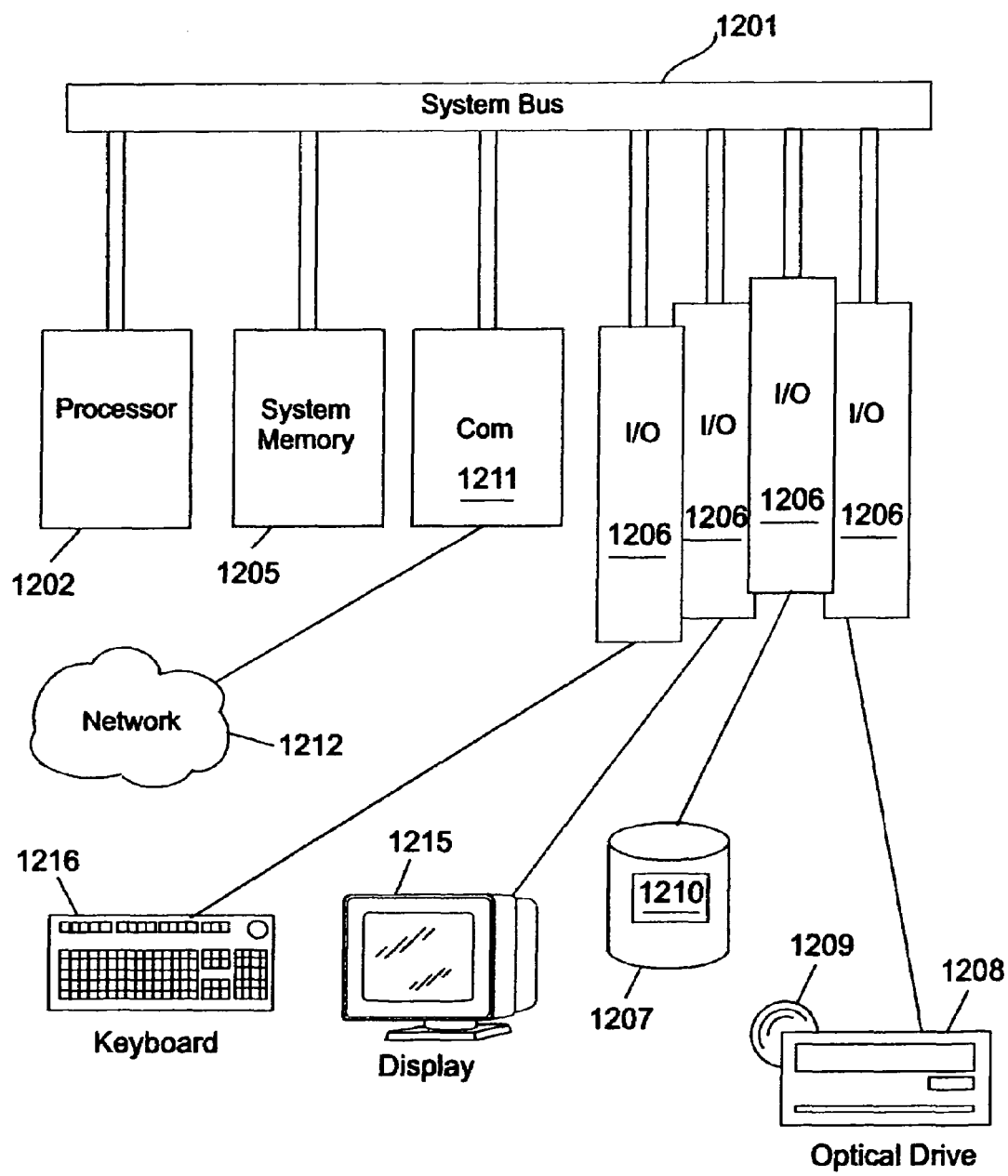
FIG. 12 is a block diagram of an instruction execution system that is implementing a bubble-pushing technique according to the invention.

FIG. 12 illustrates an instruction execution system, workstation, or personal computer system that is programmed with application software to implement the design functions that include bubble pushing. System bus 1201 interconnects the major components. The system is controlled by processor 1202, which serves as the central processing unit (CPU) for the system. System memory 1205 is typically divided into multiple types of memory or memory areas such as read-only memory (ROM), and random access memory (RAM). A plurality of standard input/output (I/O) adapters or devices, 1206, is present. A typical system can have any number of such devices; only four are shown for clarity. These connect to various devices including a fixed disk drive, 1207, and a removable media optical drive, 1208. This drive accepts writable and read-only optical disks such as compact discs (CD's) and digital versatile discs (DVD's) as shown at 1209. Computer program code instructions for implementing the appropriate functions, 1210, including the bubble pushing, are stored on the fixed disc, 1207. When the system is operating, the instructions are partially loaded into memory, 1205, and executed by processor 1202. Design files can be read and written from and to the fixed disc, or the optical disc 1209 when inserted into the optical drive. Additional I/O devices have specific functions. A workstation implementing all or a portion of the invention may contain an I/O device in the form of a network or local area network (LAN) communications (COM) adapter, 1211, to connect to the network, 1212. The network can be used to transfer software implementing the invention, or to share design files and netlists. A display, 1215, is also connected, as well as a keyboard, 1216. Any of these adapters should be thought of as functional elements more so than discrete pieces of hardware. A workstation or personal computer could have all or some of the adapter entities implemented on one circuit board. It should be noted that the system of FIG. 11 is meant as an illustrative example only. Numerous types of general-purpose computer systems and workstations are available and can be used. Available systems include those that run operating systems such as Windows™ by Microsoft, various versions of UNIX™, various versions of LINUX™, and various versions of Apple's Mac™ OS.

Computer program elements of the invention may be embodied in hardware and/or in software (including firmware, resident software, micro-code, etc.). As shown above, the invention may take the form of a computer program product, which can be embodied by a computer-usable or computer-readable storage medium having computer-usable or computer-readable, program instructions or "code" embodied in the medium for use by or in connection with the instruction execution system. Such mediums are pictured in FIG. 12 to represent the optical disc, and the fixed disc. In the context of this document, a computer-usable or computer-readable medium may be any medium that can contain, store, communicate, propagate, or transport the program for use by or in connection with the instruction execution system, apparatus, or device. The computer-usable or computer-readable medium may be, for example but not limited to, an electronic, magnetic, optical, electromagnetic, infrared, or semiconductor system, apparatus, device, or propagation medium such as the Internet. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner. The computer program product and the hardware described in FIG. 12 form the various means for carrying out the functions in some of the example embodiments.

Figure 13:
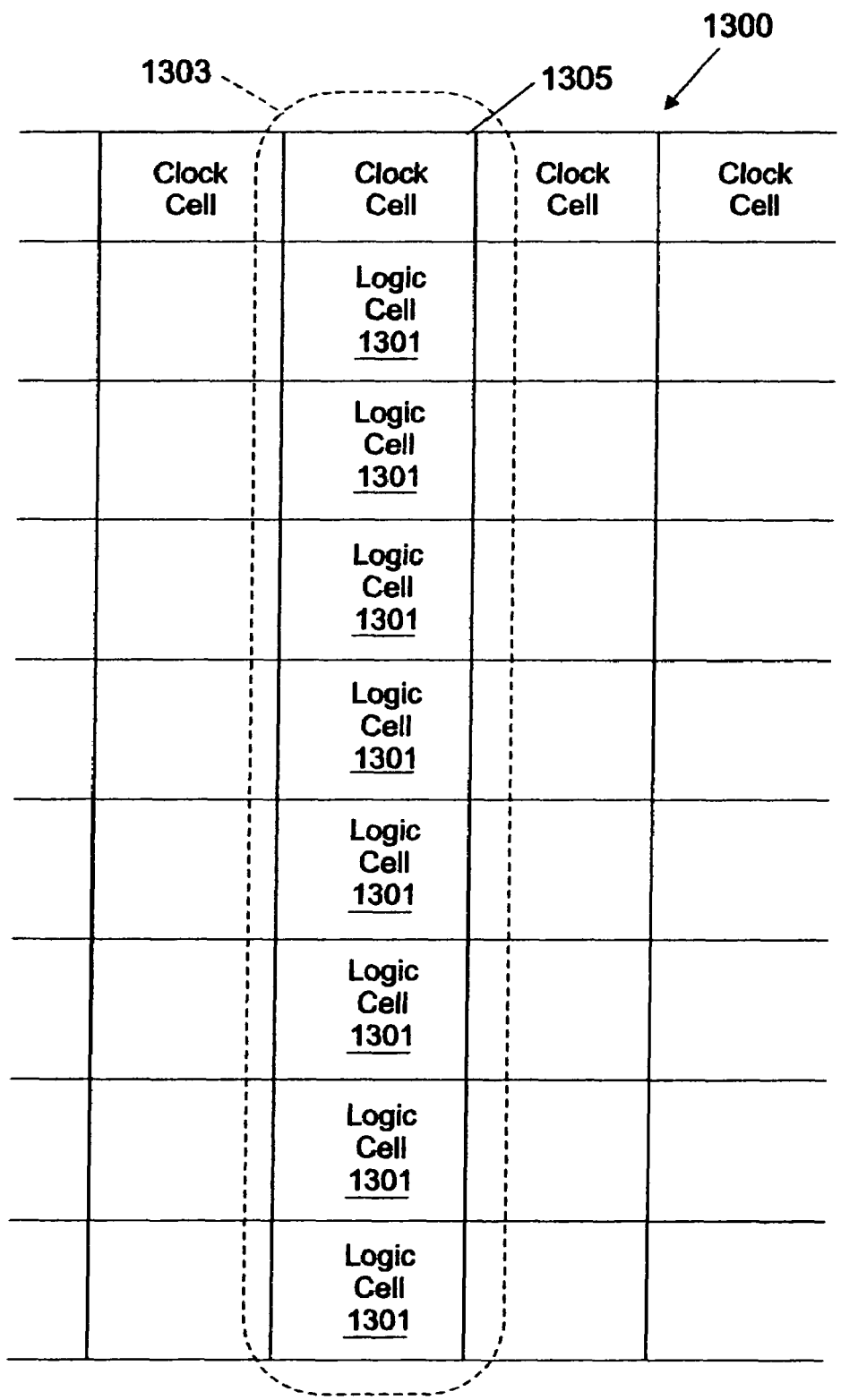
FIG. 13 illustrates a clock group within a semiconductor device according to an embodiment of the invention.

A potential problem with building FLOP's into the base macro-cell is that of gaining access to the FLOP's for test purposes. In the present example embodiments of the invention, this problem has been avoided by connecting sets, resets, and clocks of multiple FLOP's together, and building the test logic once for a group of FLOP's in a special cell called a clock cell. FIG. 13 shows a portion of a logic array, 1300, which is built according to this principle. FLOP's in a plurality of macro-cells, logic cells 1301, are pre-wired with embedded clock lines, each connected into a scan chain of potentially multiple scan chains in the base process. Multiple scan chains might need to be used in some embodiments instead of just one large scan chain to avoid dissipating too much power on test clock edges during a shift operation. An embedded clock line clocks all FLOP's in a scan chain. The cells containing the one or more scan chains that have clock lines terminated in the same cell form a clock group, 1303. The cell where the clock lines are terminated is a clock cell, 1305. An embedded scan chain through each FLOP achieves high fault coverage using traditional automatic test pattern generation (ATPG) programs. Embedding the scan chain allows the scan input (SI) and scan enable (SE) lines to be routed in base layer, which is more dense than programmable layers. To gain additional density, it is desirable to embed the other signals associated with the FLOP's: clock (CLK), and reset (RST). However, these are user-controlled signals. As a compromise, both CLK and RST are embedded in the base layers, but the user can drive them through the clock cell as a clock group. Clock groups, then, are groups of logic cells with FLOP's that share clock inputs, and possibly other inputs. In the example of FIG. 13, there are 8 logic cells per clock group. Associated with each clock group is a clock cell. This cell has as inputs the user controllable inputs to the FLOP's in each scan chain.

Figure 14:
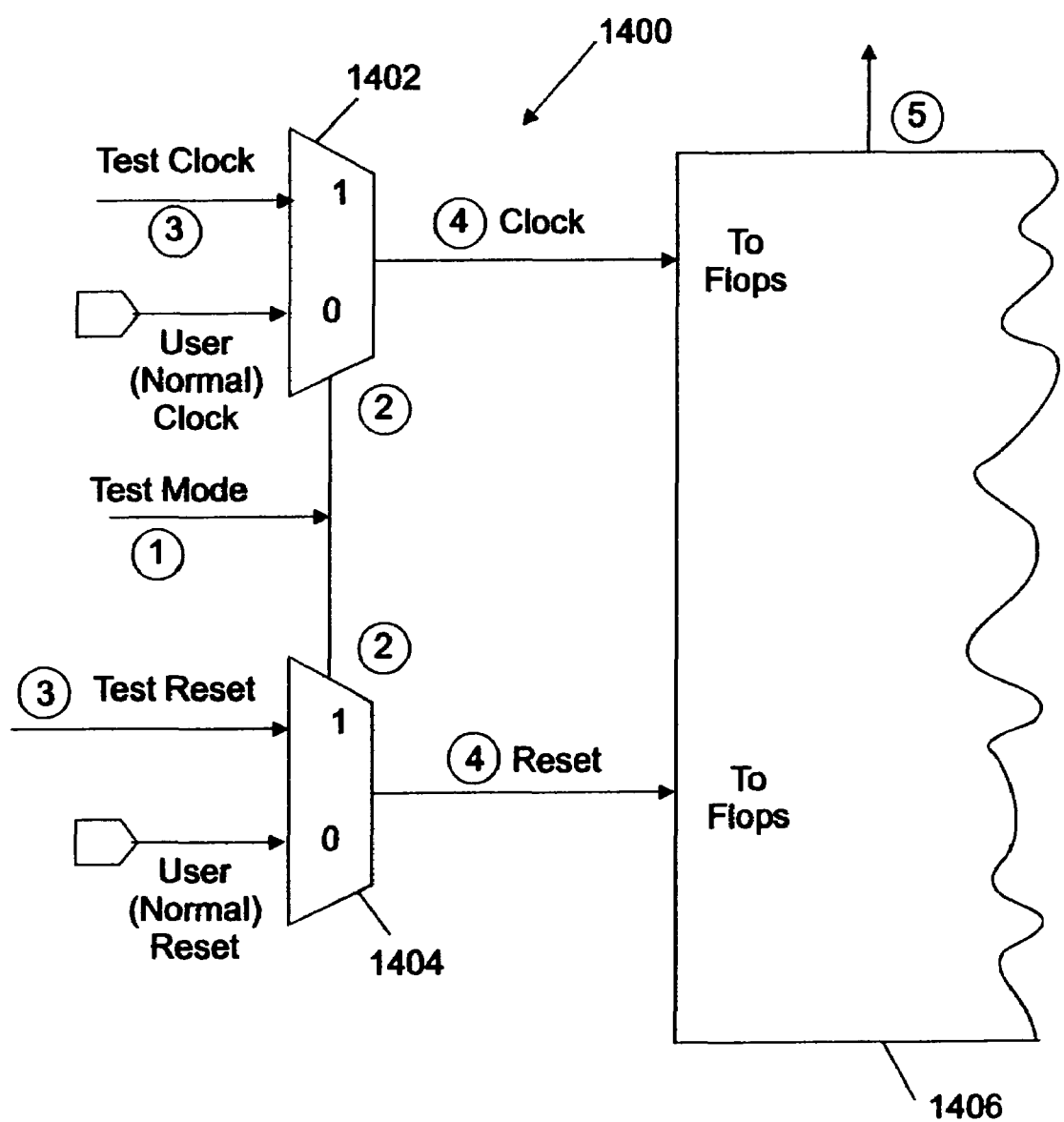
FIG. 14 is a logic diagram showing the test logic inside a clock cell according to some embodiments of the invention, as well as the method of using the test logic.

Simply having a common routing point for these inputs is enough to increase density significantly, however, the clock cell is a natural place for additional test logic to control the clock and reset signals during test. FIG. 14 illustrates test logic, 1400, for a clock cell and a test method that allows global test signals to override user signals during test mode for a scan chain in a clock group. The signals being controlled are clock and reset. Test clock and test reset lines can be routed in the base layers of the clock cell, increasing density. Clock, reset, test clock, test reset, and test mode terminal are available to the user at or near the clock cell.

In FIG. 14, a first multiplexer (MUX), 1402, switches between the test clock terminal and the user clock terminal in response to a test mode signal, which is wired to the select input of the MUX. The MUX drives the embedded clock line. Likewise, a second MUX, 1404, switches between the test reset terminal and the user reset terminal in response to a test mode signal, which is wired to its select input as well. This MUX drives the embedded reset line. FLOP's in the scan chain are located within the logic cells of the clock group, the edge of the first of which is shown at 1406. The numbers in circles in FIG. 14 illustrates high-level steps of a test method. At (1), a test mode is selected which causes a signal at the test mode terminal to cause the MUX's to switch inputs according to the signal on their select lines at (2). The test clock and test reset terminals are enabled and test data is applied at (3). The reset and clock test data is communicated through the MUX's to the scan chain at (4), and result data can be read at an external terminal of the logic array at (5).

Figure 15:
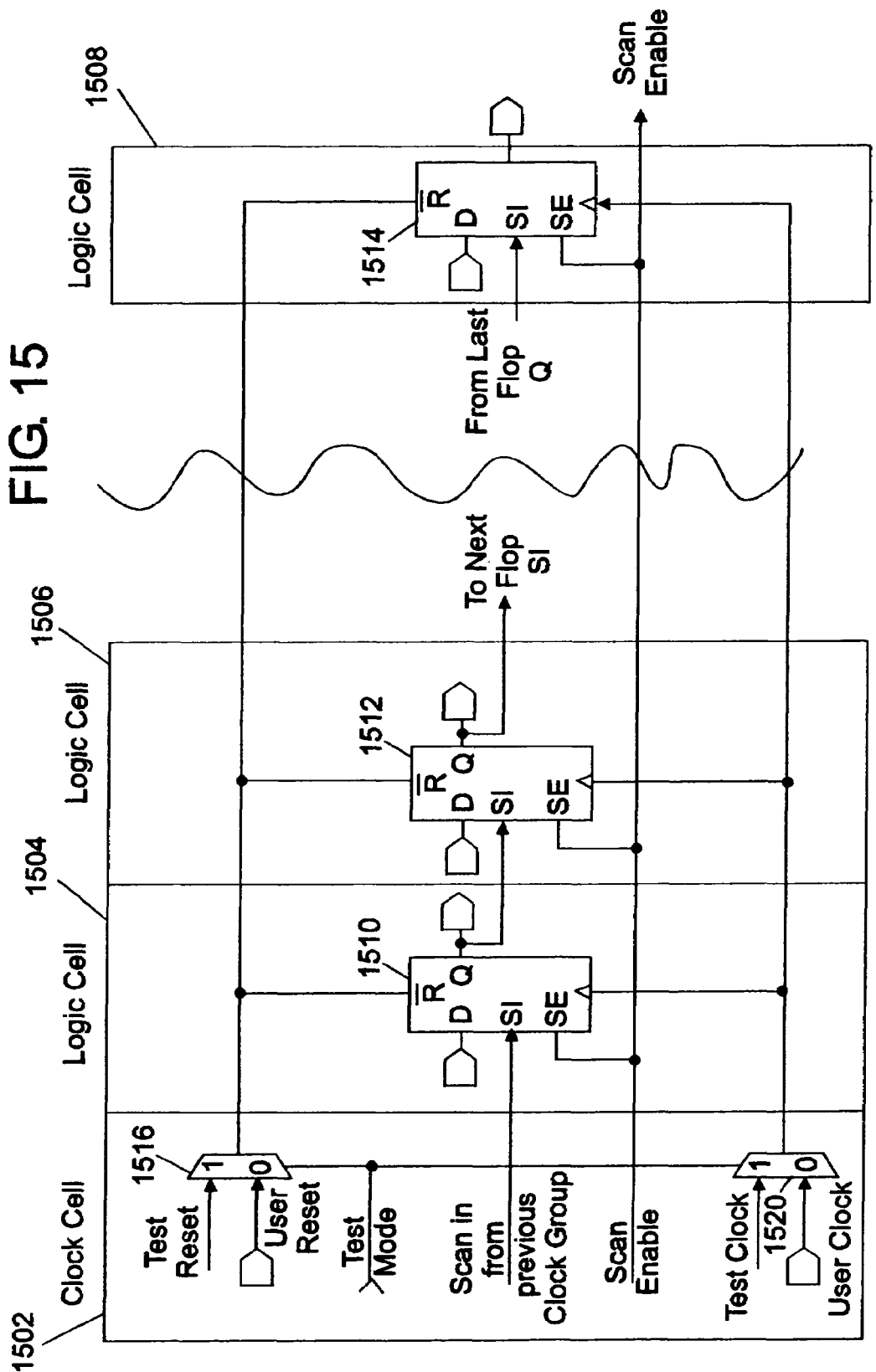
FIG. 15 is a more detailed logic diagram of an entire clock group according to some embodiments of the invention.

FIGS. 15 and 16 provide more detailed logic and schematic diagrams illustrating the constructions of the test logic and embedded clock, reset, and scan chain lines. In FIG. 15, clock cell 1502 serves a clock group that includes, among others, logic cells, 1504, 1506, and 1508. FLOP's 1510, 1512, and 1514 are part of one of the scan chains of the clock group. The scan input (SI) and scan enable (SE) are completely embedded and come from another clock group. The SE terminals are connected together for all FLOP's in the logic array and scan enable is activated during testing at a terminal that can be accessed externally. Note that the SI of each FLOP is connected to the output of a previous FLOP. Clock cell 1502 contains test logic, a circuit consisting of second and first MUX's, 1516, and 1520, as previously discussed.

Figure 16A:
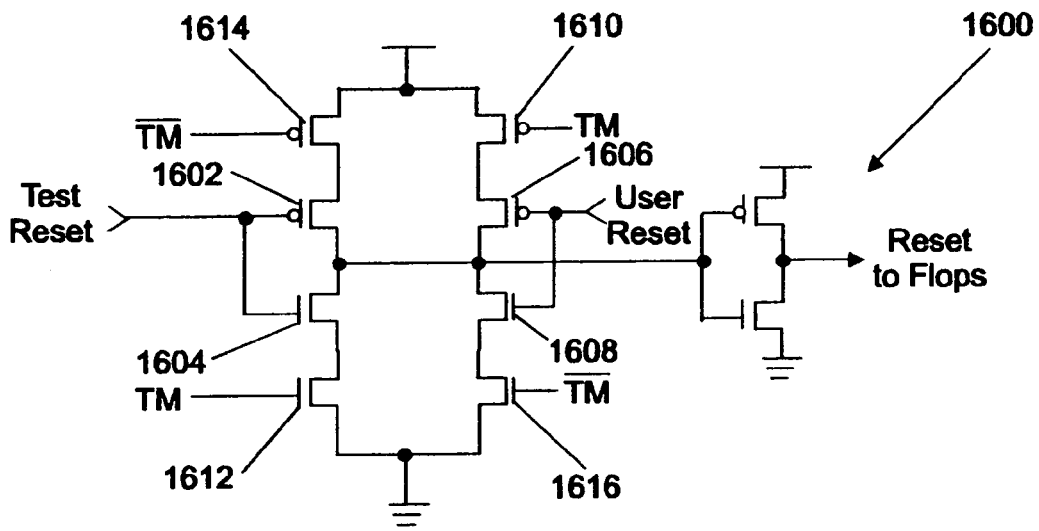
FIG. 16 is a schematic diagram showing how the test logic in a clock cell might be implemented in some embodiments.
Figure 16B:
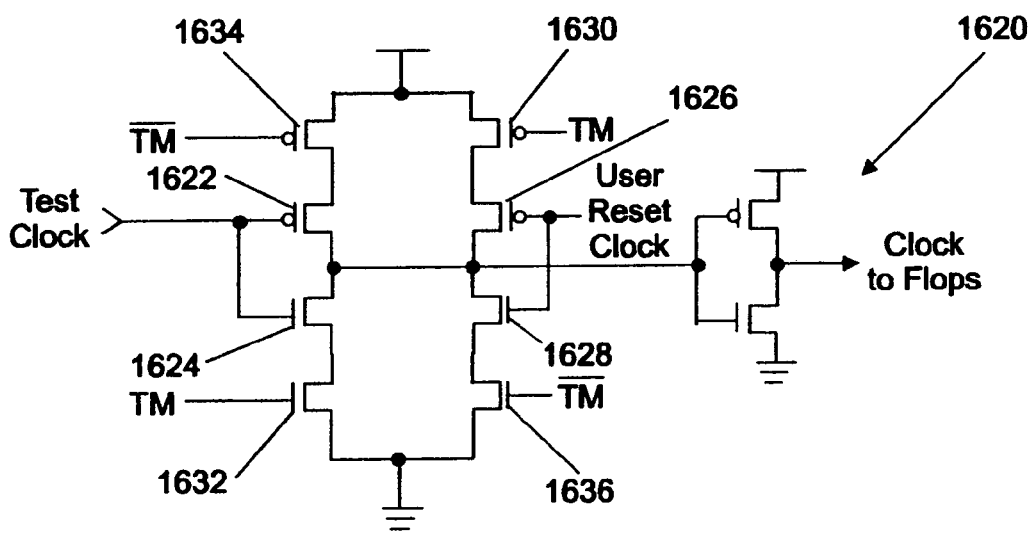
Figure 16C:
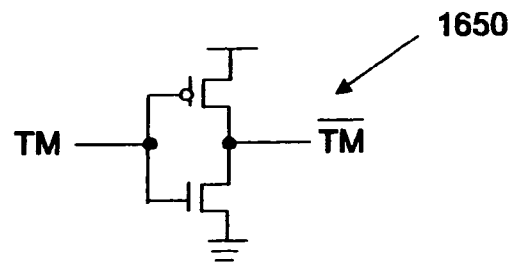

FIG. 16 shows how the clock cell test logic is implemented at the transistor level in an example embodiment. FIG. 16 is presented in three parts, FIG. 16A, FIG. 16B, and FIG. 16C. Circuit 1600 of FIG. 16A essentially implements the second MUX with test reset input to transistors 1602 and 1604, and user reset input to transistors 1606 and 1608. The test mode signal is input to transistors 1610 and 1612, and its compliment is input to transistors 1614 and 1616. Circuit 1620 of FIG. 16B implements the first MUX. For this MUX, test clock is input to transistors 1622 and 1624, and user clock is input to transistors 1626 and 1628. The test mode signal is input to transistors 1630 and 1632, and its compliment is input to transistors 1634 and 1636. FIG. 16C illustrates a circuit, 1650, similar to those previously discussed, which generates the compliment of the test mode signal.

The supply of power to unused cells in a logic array can create problems. Applying power to unused logic cells can hurt yield. A defect in an unused cell would not be likely to interfere with the normal operation of the chip, as long a power is not applied to the unused cell. Additionally, unused logic cells leak current when power is applied. Current leakage through off transistors becomes a bigger problem as process geometries shrink. In some embodiments, the architecture of the present invention features logic cells that can be used to address this problem by having power applied through the configurable metal. Logic cells that are unused can be disconnected from either $V_{DD}$ or $V_{SS}$, or both. In one embodiment, a single cell can be disconnected. However, since unused logic cells are usually grouped together, it is sometimes effective to allow power to be shared between groups of logic cells, and enable the entire group if any of the logic cells in the group are used. Grouping of unused logic cells can be enhanced with custom placement heuristics. These groups in some embodiments are the same as the clock groups previously discussed, since the placer already needs to ensure FLOP's placed within the same group share clocks, resets, and possibly other terminals.

Figure 17:
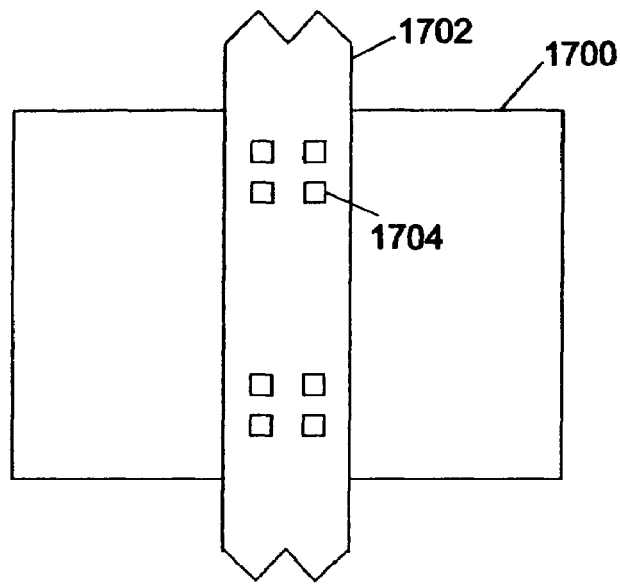
FIG. 17 illustrates a cell having a power trace with programmable connections according to one embodiment of the invention.

FIG. 17 shows a logic cell, 1700, with a power rail (a relatively large power trace), 1702, running vertically down the middle in the first programmable layer of metal. Since all power to the cell is applied through programmable connections (for example, vias), 1704, to this power rail, it is possible to programmably disconnect unused cells, thus seeing improved yield and lower total leakage current. Power can be selectively connected to gate structures within the cell by appropriately programming connections. This might be done for the entire cell, although a design could be implemented that allows power to be selectively applied to only parts of the cell.

Figure 18:
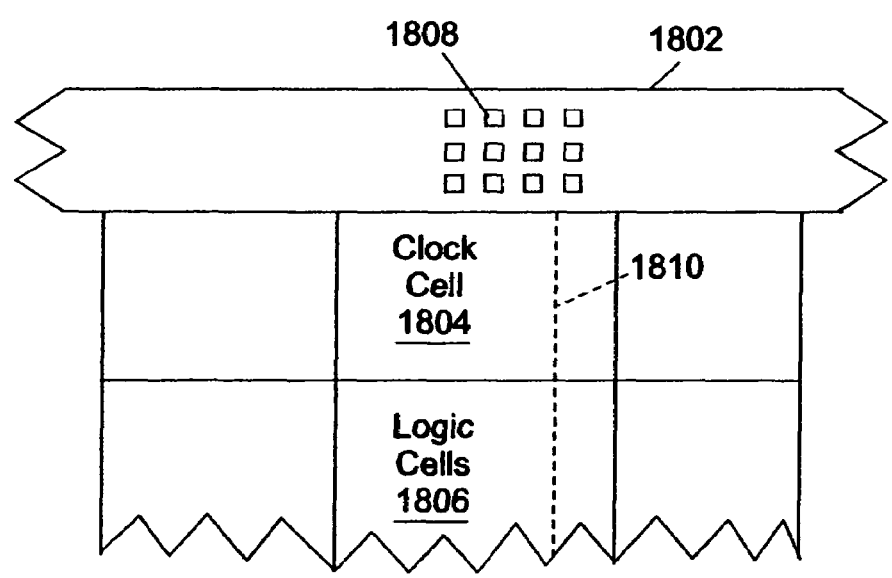
FIG. 18 illustrates a clock group having a power trace with programmable connections according to one embodiment of the invention.

To save area on programmable layers, the power rail can instead supply an entire group of cells, for example, a clock group. FIG. 18 shows an embodiment where the large power trace, 1802, adjacent to a clock cell, allows one to apply or disconnect power to an entire clock group at a time. The clock group of interest in this case consists of clock cell 1804, and logic cells, 1806. Only the first logic cell of the clock group is visible in this drawing to permit enhanced detail of the power connections to be shown. Programmable connections, 1808, allow power to be selectively connected to gate structures within the clock group via an embedded power line, 1810.

Figure 19:
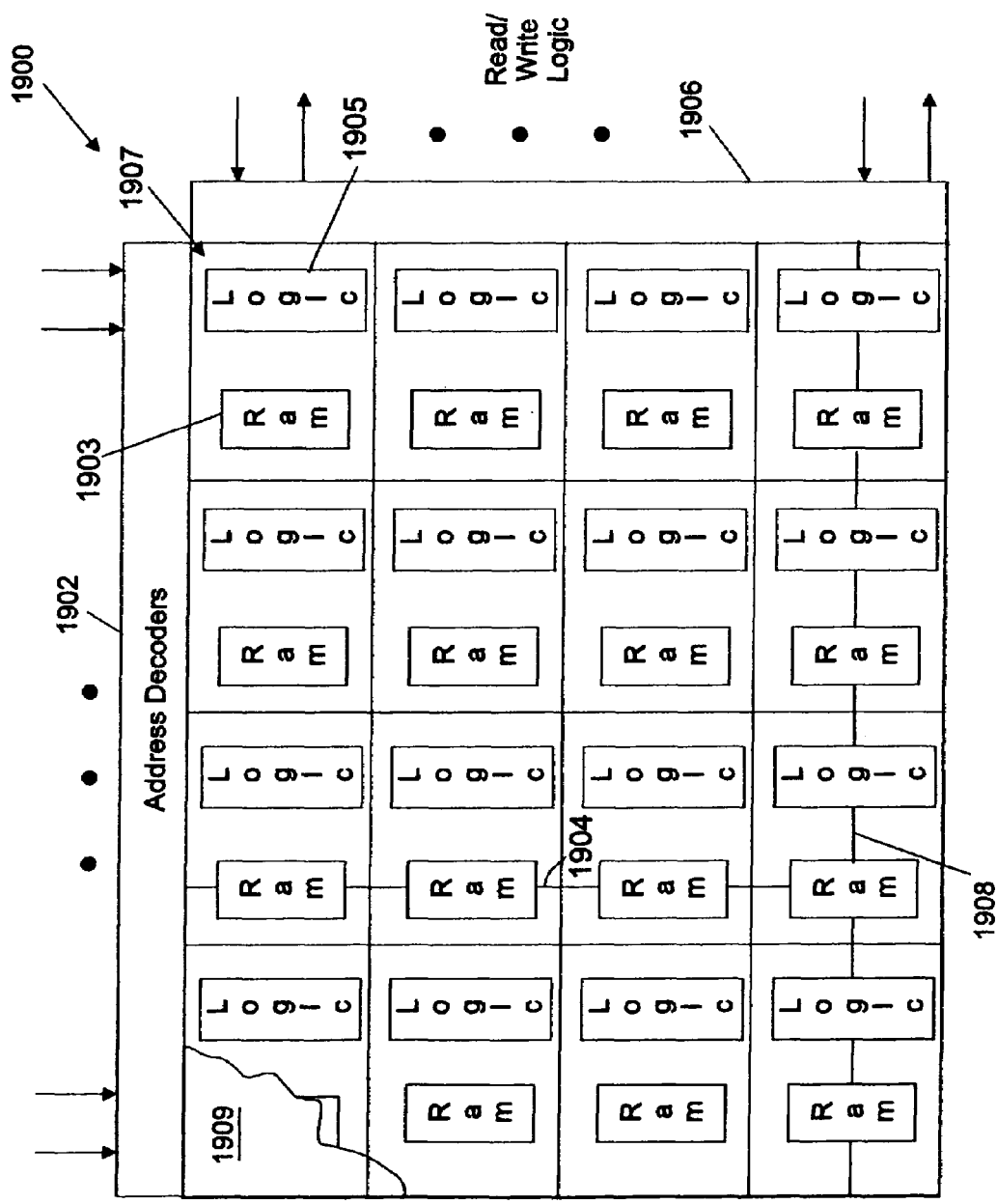
FIG. 19 is a high-level block diagram of a device according to the invention with distributed RAM.

The architecture of the present invention can optionally be further enhanced by the inclusion of distributed random access memory (RAM) in a logic array device that uses some or all of the features previously described. FIG. 19 is a conceptual, block diagram illustrating a device and chip with distributed RAM according to the invention. The device, 1900, includes read/write logic 1906 and address decoders 1902. The device of FIG. 19 also includes select lines 1904. The device also includes data lines 1908. In this case, the RAM blocks are disposed within multiple, substantially identical logic cells 1907. Each logic cell 1907 contains RAM block 1903 and gate array logic 1905 as heretofore described. It should be noted that the select and data lines for the RAM in the example embodiment are embedded within the semiconductor, for example, polysilicon portion of the chip, or are routed via the non-programmable metal layers. These lines are not routed through the programmable metal layers. In a finished device, multiple metal layers, 1909, shown in cutaway, cover the semiconductor material of the chip.

In one example, 8 by 1 RAM blocks are used in FIG. 19, and each block has eight, one-bit addressable registers. Thus, three select lines are provided per column to enable a word select function for the address decoders. In this case, a single read line and a single write line are provided per row. Although a specific word select is communicated to multiple RAM blocks, the read/write logic determines which one is actually read or written, as the case may be, in a particular column of distributed RAM. Other memory architectures can be used. In particular however, having word select lines in one direction and data lines in another works well. Word lines are for selecting a column (assuming vertical word lines) of RAM bits to be read or written. The data lines either communicate the data to be written to the selected column (assuming horizontal data lines) or allow data from the selected column to be transmitted to read/write logic at the edge. A dual-port RAM architecture can be implemented, among other ways, by having two sets of word select and data lines present, one for each port. Further details of a distributed RAM architecture that can be used with the invention are provided in commonly assigned, co-pending patent application Ser. No. 10/150,685, filed May 17, 2002, which is incorporated herein by reference.

Figure 20:
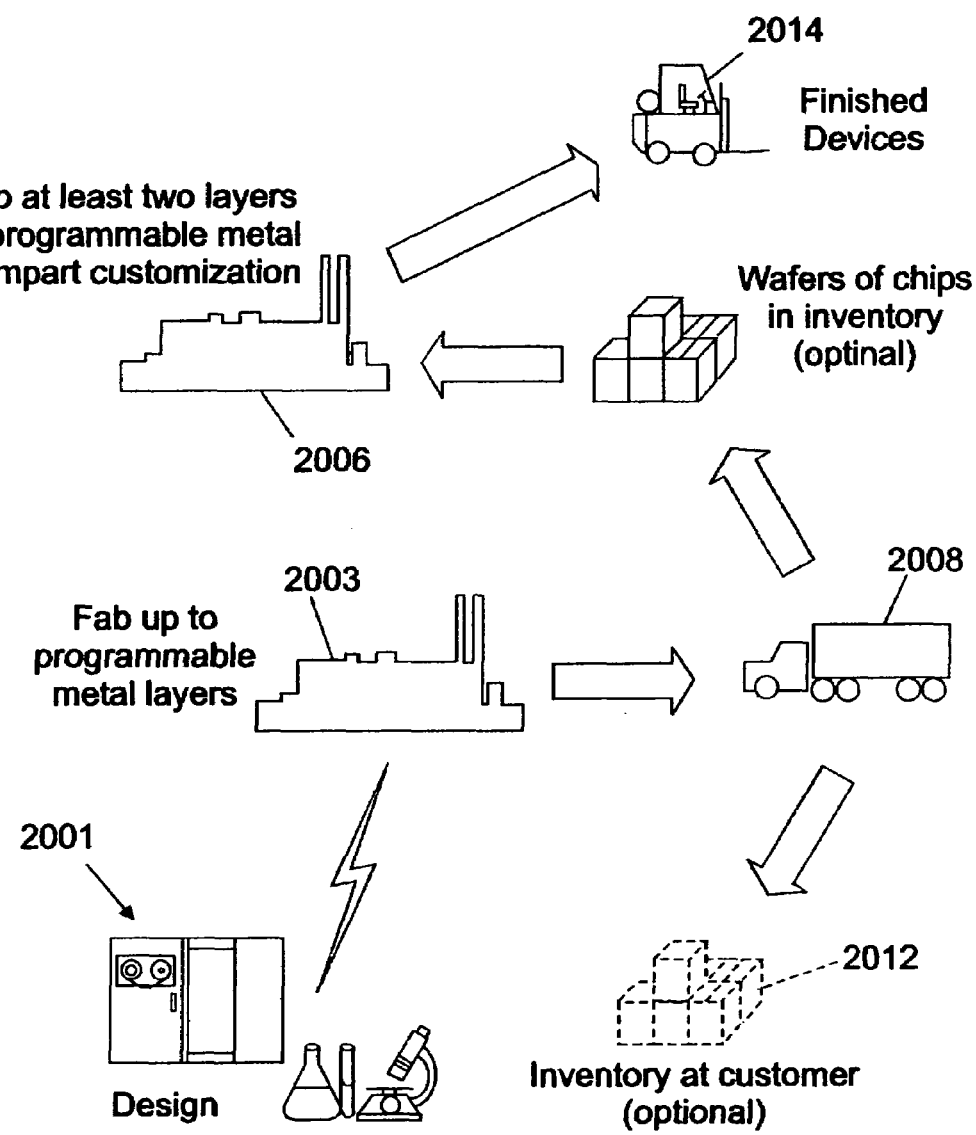
FIG. 20 illustrates a hybrid manufacturing process that can be used to manufacture devices according to some embodiments of the invention.

FIG. 20 provides additional details of a manufacturing process that is, at least in part, facilitated by the architecture of the devices described herein. The method illustrated in FIG. 20 shows an example only. There could easily be variations in the process connected where inventory is held, where devices are designed, etc.

In FIG. 20, devices are designed at 2001, typically by the customer. Design information is transmitted to the first of the two fab facilities, 2003. This first fab fabricates wafers up to the programmable metal layers, of which there will be at least two. Wafers are then transported to a second fab, 2006, as represented by the vehicle at 2008. The wafers may first be held in inventory at the second fab, or elsewhere, as shown at 2010, or by the customer as shown at 2012. The second fab, 2006, finishes the last two metal layers, also under instructions (not shown) from the customer. Finished devices leave the second fab at 2014.

The fabs in the above example perform two different "generations" or processes. One generation process is used by the first fab and another generation process is used by the second fab. A generation is a set of tools and processes to produce gate array devices with transistors of a specific, minimum size, in terms of physical gate length. For example 0.35-micron, 0.25-micron, 0.18-micron, 0.13 micron, and 90 nm are all well-known generations of processes, in order of less advanced to more advanced, and recent, generations. Generally smaller sizes are more difficult to achieve, but allow for denser logic, translating into devices with more capability. Hybrid devices manufactured according to the method disclosed above will typically be made in two fabs that are at least one, and possibly more generations apart. Typically, the second fab will be an older generation fab. A process is said to have a larger or small geometry if that process would result in, respectively, larger or smaller gate sizes if the process were used to produce gates. If a process is used to etch metal, the geometries and sizes are still referred to the same way, taking into account sizes as if the process were used to produce gates.

Specific embodiments of an invention are described herein. One of ordinary skill in the semiconductor arts will quickly recognize that the invention has other applications in other environments. In fact, many embodiments and implementations are possible. The following claims are in no way intended to limit the scope of the invention to the specific embodiments described above.

I claim:

1. A semiconductor device comprising an array of logic cells and programmable metal adjacent to the array of logic cells, the semiconductor device further comprising:
   a power trace within the programmable metal traversing at least one cell of the array of logic cells; and
   a programmable connection between the power trace and the at least one cell wherein power has been selectively connected to gate structures within the at least one cell.

2. The semiconductor device of claim 1 wherein the programmable connection is a via.

3. The semiconductor device of claim 1 wherein the plurality of gate structures further comprises:
   a plurality of NAND gates;
   a plurality of multiplexers;
   a FLOP; and
   an high-drive inverter.

4. The semiconductor device of claim 2 wherein the plurality of gate structures further comprises:
   a plurality of NAND gates;
   a plurality of multiplexers;
   a FLOP; and
   an high-drive inverter.

5. The semiconductor device of claim 1 further comprising an embedded clock line common to a plurality of the logic cells.

6. The semiconductor device of claim 5 further comprising an embedded reset line common to the plurality of logic cells.

7. The semiconductor device of claim 6 further comprising test logic connected to the embedded clock line and the embedded reset line.

8. The semiconductor device of claim 2 further comprising an embedded clock line common to a plurality of the logic cells.

9. The semiconductor device of claim 8 further comprising an embedded reset line common to the plurality of logic cells.

10. The semiconductor device of claim 9 further comprising test logic connected to the embedded clock line and the embedded reset line.

* * * * *